July 28, 1959 A. P. KRUPER 2,897,421

PHOTOTRANSISTOR DESIGN

Filed Aug. 11, 1954

WITNESSES:

E. A. McCloskey

C. F. Renz

INVENTOR

Andrew P. Kruper.

BY

F. E. Browder

ATTORNEY

United States Patent Office 2,897,421

Patented July 28, 1959

2,897,421

PHOTOTRANSISTOR DESIGN

Andrew P. Kruper, Pittsburgh, Pa., assignor to Westinghouse Electric Corporation, East Pittsburgh, Pa., a corporation of Pennsylvania Application August 11, 1954, Serial No. 449,224

4 Claims. (Cl. 317—235)

My invention relates to phototransistors and in particular to novel structures of phototransistors which provide a maximum effective volume of light-sensitive material for a given volume of semiconductor.

Germanium, an element in the fourth group of the periodic table, is an electrical semiconductor; that is to say, it has an electrical conductivity which is low compared with that of the metallic elements, but is still much higher than that of such substances as most porcelains and glasses. It is found that when it is alloyed with a small fraction of a substance such as indium from the third group of that table, or antimony from the fifth group, its electrical conductivity is very sensitive to the incidence of light. In very recent years, electrical devices known as "transistors," usually comprising germanium or silicon alloyed with small quantities of elements from group III p-type, or group V n-type impurities of the periodic table, have undergone extensive development; the "transistor" comprising one or two junctions between layers of semiconductor of slightly different composition. Such transistors, and circuits for employing them in control circuits of various types are described in a book "Principles of Transistor Circuits" by Richard F. Shea, published in 1953 by Wiley and Sons, New York. Phototransistors are those particularly adapted to employ the above-mentioned response of transistor junctions to incident light.

A type of phototransistor now marketed comprises the emitter junction formed between a pellet of indium and a base of n-type germanium but is of such small size that it is almost imperative to use a finely focussed light beam for its irradiation, and such an arrangement is ill-adapted for response to general illumination and to illumination from a moving source. My present invention overcomes these disadvantages by providing a photosensitive area of relatively large dimensions and one, moreover, which gives a large ratio of effective photosensitive material to the entire volume of the semiconductor used.

One object of my invention is accordingly to provide a new and improved structure for phototransistors.

Another object is to provide a form of phototransistor providing a photosensitive junction of large area.

Another object is to provide a phototransistor in which the effective photosensitive material comprises a high fraction of the semiconductor used.

Other objects of my invention will become apparent upon reading the following description taken in connection with the drawings, in which.

Figure 1:
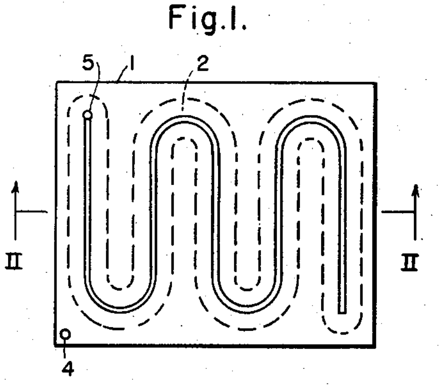
Figure 1 is a schematic plan view of one modification of my invention.
Figure 2:
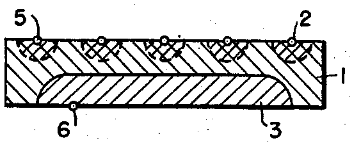
Fig. 2 is a section of Fig. 1 along the line II—II.

Referring to Figs. 1 and 2 in detail, a wire of indium or other element from group III is bent into parallel limbs, laid on top of a plate about .005 in. thick of n-type germanium or other element from group IV of the periodic table, and heated. The indium will alloy with germanium, diffusing into the latter, to form a wave-shaped path 2 comprising indium-germanium alloy or p-type germanium. The heating and consequent diffusion should be continued until the parallel limbs coalesce thus forming what may be spoken of somewhat crudely as a layer 2 of the alloy forming an emitter junction with germanium plate 1. The lower face of the germanium plate 1 may be alloyed by heating with a layer 3 comprising an element also from group III of the periodic tables; e.g. with indium, thereby forming a collector junction with the plate 1. The upper layer 2 may be connected in circuits such as those described in the above-mentioned book to act as an emitter electrode; germanium layer 1 acting as a base, and the layer 3 acting as a collector. Thus, terminals 4, 5, 6 may be attached to layers 2, 1 and 3.

Figure 3:
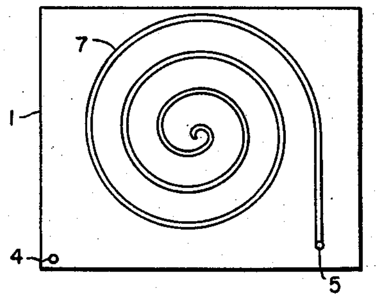
Figs. 3, 4 and 5 are views similar to Fig. 1 of other modifications of my invention.

Fig. 3 shows a structure similar to Figs. 1 and 2 except that the indium wire is coiled into a helix 7 before being alloyed and diffused into the germanium plate 1.

Figure 4:
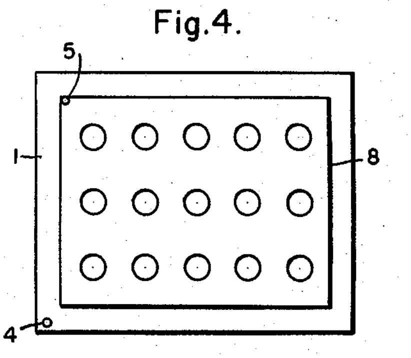

In Fig. 4, the indium is provided in the form of a perforated layer or plate 8 before alloying with germanium plate 1.

Figure 5:
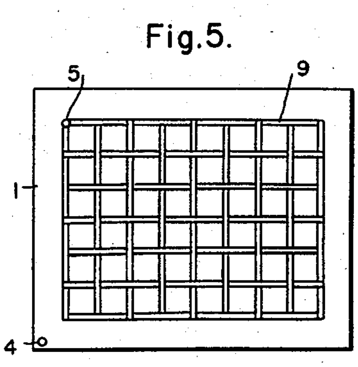

In Fig. 5, the indium is provided as a net or grid 9 of wires before being heated and alloyed with germanium plate 1.

It may be of assistance in making the structures of Figs. 1, 3 and 5 to cut a narrow groove in the germanium plate to receive the indium wire as this will prevent the latter from gathering into separate globules by surface tension when it is melted. When the germanium is thus channeled, the indium may be supplied as a powder. As another alternative procedure, the group III material could be applied as a thin layer to the germanium by evaporation, in accordance with well-known techniques, and heated to cause alloying. The above will produce a p-n-p type phototransistor.

If p-type germanium is used for the base and an element from the group V of the periodic table is applied to it, for emitter and collector an n-p-n type phototransistor will result.

Similarly, n-type or p-type silicon or a germanium-silicon alloy can be used for the base material, and emitter and collector junctions produced by suitably alloying with group III or group V elements.

Another method of providing an emitter and one which would provide the maximum usable photosensitive area would be to employ a barrier-layer technique, and provide electrical contact to this emitter-barrier by evaporating a semi-transparent electrode for electrical connection.

I claim as my invention:

1. A photoelectric device comprising a plate of one conductivity type material selected from the group consisting of silicon and germanium, an inclusion zone on one surface of said plate of opposite conductivity type material to form a P–N junction with said plate material, said inclusion zone defining a predetermined geometrical pattern on the surface of said plate, said geometrical pattern on the surface of said plate being characterized by areas of said one conductivity type material separated by areas of said opposite conductivity type material said areas having a P–N junction between them, said P–N junction having a comparatively large exposed photosensitive area, all said areas of said one conductivity type material being connected to form one electrode, and all said areas of said opposite conductivity type material being connected to form another electrode, and a counter electrode on the opposite surface of said plate of the same conductivity material as said inclusion zone and forming a P–N junction with said plate material.

2. A photoelectric device comprising a plate of one conductivity type material selected from the group consisting of silicon and germanium, a diffusion zone on one surface of said plate of opposite conductivity type material to form a P–N junction with said plate material, said diffusion zone defining a predetermined geometrical pattern on the surface of said plate, said geometrical pattern on the surface of said plate being characterized by areas of said one conductivity type material separated by areas of said opposite type conductivity said areas having a P–N junction between them, said P–N junction having a comparatively large exposed photosensitive area, all said areas of said one conductivity type material being connected to form one electrode, and all said areas of said opposite conductivity type material being connected to form another electrode, and a diffused counter electrode on the opposite surface of said plate of the same conductivity material as said diffusion zone and forming a P–N junction with said plate material.

3. A photoelectric device comprising a plate of one conductivity type material selected from the group consisting of silicon and germanium, said plate having a thickness of .005 inch, a diffusion zone on one surface of said plate of opposite conductivity type material to form a P–N junction with said plate material, said diffusion zone defining a predetermined geometrical pattern on the surface of said plate being characterized by areas of said one conductivity type material separated by areas of said opposite conductivity type material said areas having a P–N junction between them, said P–N junction having a comparatively large exposed photosensitive area, all said areas of said one conductivity type material being connected to form one electrode, and all said areas of said opposite conductivity type material being connected to form another electrode, and a diffused counter electrode on the opposite surface of said plate of the same conductivity material as said diffusion zone and forming a P–N junction with said plate material.

4. A photoelectric device comprising a plate of one conductivity type material selected from the group consisting of silicon and germanium, a diffusion zone on one surface of said plate of opposite conductivity type material to form a P–N junction with said plate material, said diffused zone defining a predetermined geometrical pattern on the surface of said plate, said geometrical pattern on the surface of said plate being characterized by areas of said one conductivity type material separated by areas of said opposite conductivity type material said areas having a P–N junction between them, said P–N junction having a comparatively large exposed photosensitive area, all said areas of said one conductivity type material being connected to form one electrode, and all said areas of said opposite conductivity type material being connected to form another electrode, a diffused counter electrode on the opposite surface of said plate of the same conductivity material as said diffusion zone and forming a P–N junction with said plate material, and means for applying voltages to said plate, said diffusion zone and said diffused counter electrode.

References Cited in the file of this patent

UNITED STATES PATENTS

| | | |
|---|---|---|
| 2,629,800 | Pearson | Feb. 24, 1953 |
| 2,644,852 | Dunlap | July 7, 1953 |
| 2,666,814 | Shockley | Jan. 19, 1954 |
| 2,672,528 | Shockley | Mar. 16, 1954 |
| 2,707,762 | Steutzer | May 3, 1955 |
| 2,721,965 | Hall | Oct. 25, 1955 |
| 2,754,431 | Johnson | July 10, 1956 |
| 2,756,483 | Wood | July 31, 1956 |